(12) United States Patent
Padmanabhan et al.

(10) Patent No.: US 9,735,095 B2
(45) Date of Patent: Aug. 15, 2017

(54) SEMICONDUCTOR COMPONENT AND METHOD OF MANUFACTURE

(71) Applicant: Semiconductor Components Industries, LLC, Phoenix, AZ (US)

(72) Inventors: Balaji Padmanabhan, Tempe, AZ (US); Prasad Venkatraman, Gilbert, AZ (US); Ali Salih, Mesa, AZ (US); Chun-Li Liu, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/204,604

(22) Filed: Jul. 7, 2016

(65) Prior Publication Data

US 2017/0025338 A1   Jan. 26, 2017

Related U.S. Application Data

(60) Provisional application No. 62/196,641, filed on Jul. 24, 2015.

(51) Int. Cl.
*H01L 23/49* (2006.01)
*H01L 23/495* (2006.01)
(Continued)

(52) U.S. Cl.
CPC .. *H01L 23/49575* (2013.01); *H01L 23/49524* (2013.01); *H01L 23/49562* (2013.01); *H01L 25/074* (2013.01); *H01L 25/50* (2013.01); *H01L 23/49531* (2013.01); *H01L 2224/0603* (2013.01); *H01L 2224/16245* (2013.01);
(Continued)

(58) Field of Classification Search
CPC ......... H01L 23/49575; H01L 23/49503; H01L 23/49562; H01L 25/50; H01L 25/074; H01L 21/4825; H01L 23/4952; H01L 2924/00; H01L 2924/00014; H01L 2224/48247; H01L 2224/73265; H01L 2924/00012; H01L 2224/32245; H01L 2924/181; H01L 2924/13091;
(Continued)

(56) References Cited

U.S. PATENT DOCUMENTS 7,745,913 B2   6/2010   Hosseini et al.
8,455,987 B1   6/2013   Spann et al.
(Continued)

*Primary Examiner* — Roy Potter
*Assistant Examiner* — Paul Patton
(74) *Attorney, Agent, or Firm* — Rennie William Dover

(57) ABSTRACT

In accordance with an embodiment, a semiconductor component includes a support having first and second device receiving structures. A semiconductor device configured from a III-N semiconductor material is coupled to the support, wherein the semiconductor device has opposing surfaces. A first bond pad extends from a first portion of the first surface, a second bond pad extends from a second portion of the first surface, and a third bond pad extends from a third portion of the first surface. The first bond pad is coupled to the first device receiving portion, the drain bond pad is coupled to the second device receiving portion, and the third bond pad is coupled to the third lead. In accordance with another embodiment, a method includes coupling a semiconductor chip comprising a III-N semiconductor substrate material to a support.

20 Claims, 9 Drawing Sheets

(51) Int. Cl.
   *H01L 25/07*   (2006.01)
   *H01L 25/00*   (2006.01)
(52) U.S. Cl.
   CPC   *H01L 2224/40* (2013.01); *H01L 2224/40245* (2013.01); *H01L 2224/48091* (2013.01); *H01L 2224/48247* (2013.01)
(58) Field of Classification Search
   CPC ..... H01L 2924/014; H01L 2224/45124; H01L 2224/05
   See application file for complete search history.

(56) References Cited

U.S. PATENT DOCUMENTS

| | | |
|---|---|---|
| 2007/0249092 A1 | 10/2007 | Joshi et al. |
| 2008/0164590 A1 | 7/2008 | Xiaochun et al. |
| 2010/0232131 A1 | 9/2010 | Qian et al. |
| 2011/0133251 A1 | 6/2011 | He |
| 2012/0223321 A1 | 9/2012 | Lin et al. |
| 2012/0223322 A1 | 9/2012 | Lin et al. |
| 2013/0069208 A1 | 3/2013 | Briere |
| 2013/0088280 A1 | 4/2013 | Lal et al. |
| 2013/0175704 A1 | 7/2013 | Jeun |
| 2013/0256856 A1 | 10/2013 | Mahler et al. |
| 2014/0103510 A1 | 4/2014 | Andou |
| 2014/0197525 A1 | 7/2014 | Kadoguchi |
| 2014/0239472 A1 | 8/2014 | Jones et al. |
| 2014/0361419 A1 | 12/2014 | Xue et al. |
| 2015/0145112 A1 | 5/2015 | Otremba |
| 2016/0211246 A1* | 7/2016 | Akiyama ............ H01L 21/8213 |
| 2016/0247792 A1 | 8/2016 | Chang |

* cited by examiner

SEMICONDUCTOR COMPONENT AND METHOD OF MANUFACTURE

The present application is a nonprovisional application of Provisional Patent Application No. 62/196,641 filed on Jul. 24, 2015, by Balaji Padmanabhan et al., titled "SEMICONDUCTOR COMPONENT AND METHOD OF MANUFACTURE", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have used a combination of silicon semiconductor materials and III-N semiconductor materials to manufacture cascoded devices, such as a normally-on III-N depletion mode HEMT cascoded with an enhancement mode silicon device. Using this combination of materials helps achieve a normally-off state using a III-N depletion mode device that is normally-on. Cascoded semiconductor devices have been described in U.S. Patent Application Publication Number 2013/0088280 A1 by Rakesh K. Lal et al. and published on Apr. 11, 2013.

After manufacturing cascoded devices from different semiconductor substrate materials, semiconductor component manufacturers typically protect the silicon device and the depletion mode devices by encapsulating them in separate packages and connecting the devices in the separate packages together via leadframe leads to form a cascoded device. A drawback with this approach is that increasing the number of packages increases the cost of a cascoded semiconductor component and degrades the performance of the cascoded devices because of increased parasitics such as parasitic capacitance and parasitic inductance.

Accordingly, it would be advantageous to have a cascoded semiconductor device and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
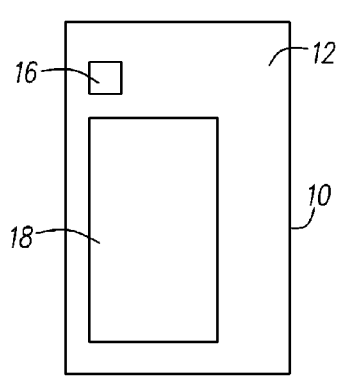
FIG. 1 is a top view of a semiconductor chip suitable for use in manufacturing a cascode configured semiconductor component in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

FIG. 1 is a top view of a semiconductor chip 10 suitable for use in manufacturing a semiconductor component in accordance with an embodiment of the present invention. Semiconductor chip 10 has a top surface 12 and a bottom surface 14 (shown in at least FIG. 8). In accordance with an embodiment, semiconductor chip 10 is a silicon chip that may include a vertical field effect semiconductor device having a gate bond pad 16 formed on or from surface 12, a source bond pad 18 formed on or from surface 12, and a drain electrode 20 (shown in FIGS. 8, 10, 12, 14, 18 and 20) formed on or from surface 14. It should be noted that the semiconductor device formed in or from semiconductor chip 10 is not limited to being a vertical field effect transistor or a field effect transistor. For example, the semiconductor device may be an insulated gate bipolar transistor, a bipolar transistor, a junction field effect transistor, a diode, a lateral field effective transistor or the like. By way of example, semiconductor chip 10 is a silicon semiconductor chip, i.e., the substrate material of silicon semiconductor chip 10 comprises silicon. A silicon semiconductor material may be referred to as silicon based semiconductor material, a silicon semiconductor material, or the like. A semiconductor chip such as, for example semiconductor chip 10, may be referred to as a semiconductor die.

Figure 2A:
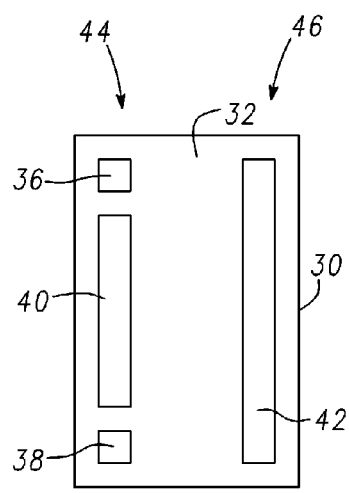
FIG. 2A is a top view of a semiconductor chip suitable for use in manufacturing a cascode configured semiconductor component in accordance with an embodiment of the present invention.

FIG. 2A is a top view of a semiconductor chip 30 suitable for use in manufacturing a semiconductor component in accordance with another embodiment of the present invention. Semiconductor chip 30 has a top surface 32 and a bottom surface 34 (shown in FIG. 18), wherein gate bond pads 36 and 38 are formed on or from top surface 32, a source bond pad 40 is formed on or from top surface 32, and a drain bond pad 42 is formed on or from top surface 32. Source bond pad 40 is formed between gate bond pads 36 and 38 and on a side 44 of semiconductor chip 30 whereas drain bond pad 42 is formed on a side 46 of semiconductor chip 30. Sides 44 and 46 are on opposite sides of semiconductor chip 30. It should be noted that gate bond pads 36 and 38 may be electrically connected together through the substrate material of semiconductor chip 30. The gate bond pads 36 and 38 may also be electrically connected in the layout of the semiconductor chip 30. Semiconductor chip 30 is fabricated from a compound semiconductor material such as, for example, a III-nitride semiconductor material. Thus, semiconductor chip 30 may be referred to as a III-nitride semiconductor chip, i.e., the substrate material of III-nitride semiconductor chip 30 comprises a III-nitride material such as, for example, aluminum nitride. A III-nitride semiconductor material may be referred to as a III-N semiconductor material, a III-nitride based semiconductor material, a III-N based semiconductor material, or the like. Suitable III-N materials include gallium nitride, or the like. A semiconductor chip such as, for example, semiconductor chip 30 may be referred to as a semiconductor die. A semiconductor chip 30 can also be fabricated on silicon substrate.

Figure 2B:
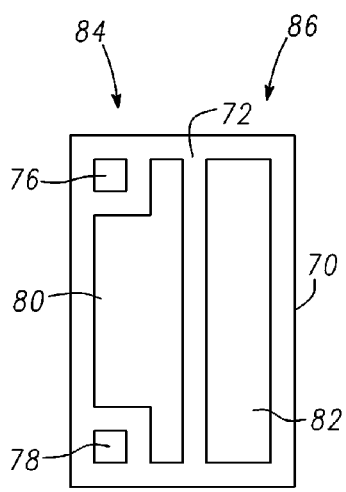
FIG. 2B is a top view of a semiconductor chip suitable for use in manufacturing a cascode configured semiconductor component in accordance with an embodiment of the present invention.

FIG. 2B is a top view of a semiconductor chip 70 suitable for use in manufacturing a semiconductor component in accordance with another embodiment of the present invention. Semiconductor chip 70 has a top surface 72 and a bottom surface 74, wherein gate bond pads 76 and 78 are formed on or from portions of top surface 72, a source bond pad 80 is formed on or from another portion of top surface 72, and a drain bond pad 82 is formed on or from another portion of top surface 72. Source bond pad 80 is formed between gate bond pads 76 and 78 and on a side 84 of semiconductor chip 70 whereas drain bond pad 82 is formed on a side 86 of semiconductor chip 70. FIG. 2B is similar to FIG. 2A except that both the source and the drain bond pads are formed on the active area of the device. Thus, these pads may be much larger compared to the layout shown in FIG. 2A but does not add any significant area for the pads as they are formed on top of the active area of the device. Placing the bond pads over an active area increases the contact area, reduces cost, and improves thermal performance.

Sides 84 and 86 are on opposite sides of semiconductor chip 70. It should be noted that gate bond pads 76 and 78 may be electrically connected together through the substrate material of semiconductor chip 70. Gate bond pads 76 and 78 may also be electrically connected in the layout of the semiconductor chip 70. Semiconductor chip 70 is fabricated from a compound semiconductor material such as, for example, a III-nitride semiconductor material. Thus, semiconductor chip 70 may be referred to as a III-nitride semiconductor chip, i.e., the substrate material of III-nitride semiconductor chip 70 comprises a III-nitride material such as, for example, aluminum nitride. A III-nitride semiconductor material may be referred to as a III-N semiconductor material, a III-nitride based semiconductor material, a III-N based semiconductor material, or the like. Suitable III-N materials include gallium nitride, or the like. A semiconductor chip such as, for example, semiconductor chip 70 may be referred to as a semiconductor die. A semiconductor chip 70 can also be fabricated on silicon substrate.

Figure 3A:
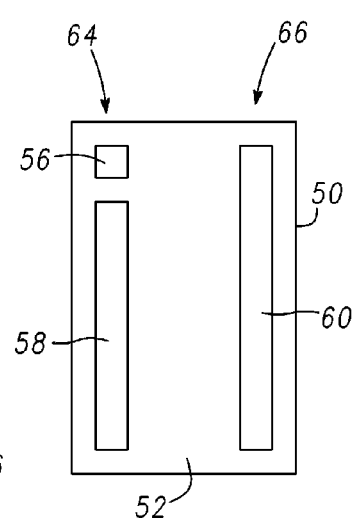
FIG. 3A is a top view of a semiconductor chip suitable for use in manufacturing a cascode configured semiconductor component in accordance with an embodiment of the present invention.

FIG. 3A is a top view of a semiconductor chip 50 suitable for use in manufacturing a semiconductor component in accordance with another embodiment of the present invention. Semiconductor chip 50 has a top surface 52 and a bottom surface 54 (shown in FIGS. 8, 10, 12, 14, 16 and 20), wherein a gate bond pad 56 is formed on or from a portion of top surface 52, a source bond pad 58 is formed on or from another portion of top surface 52, and a drain bond pad 60 is formed on or from yet another portion of top surface 52. Gate bond pad 56 and source bond pad 58 are formed on a side 64 of semiconductor chip 50 whereas drain bond pad 60 is formed on a side 66 of semiconductor chip 50. Sides 64 and 66 are on opposite sides of semiconductor chip 50.

Semiconductor chip 50 is fabricated from a compound semiconductor material such as, for example, a III-nitride semiconductor material. Thus, semiconductor chip 50 may be referred to as a III-nitride semiconductor chip, i.e., the substrate material of III-nitride semiconductor chip 50 comprises a III-nitride material such as, for example, aluminum nitride. A III-nitride semiconductor material may be referred to as a III-N semiconductor material, a III-nitride based semiconductor material, a III-N based semiconductor material, or the like. Suitable III-N materials include gallium nitride, or the like. A semiconductor chip such as, for example semiconductor chip 50 may be referred to as a semiconductor die. A semiconductor chip 50 can also be fabricated on silicon substrate.

Figure 3B:
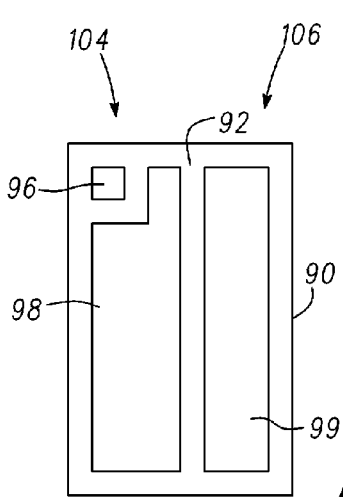
FIG. 3B is a top view of a semiconductor chip suitable for use in manufacturing a cascode configured semiconductor component in accordance with an embodiment of the present invention.

FIG. 3B is a top view of a semiconductor chip 90 suitable for use in manufacturing a semiconductor component in accordance with another embodiment of the present invention. Semiconductor chip 90 has a top surface 92 and a bottom surface 94 wherein a gate bond pad 96 is formed on or from a portion of top surface 92, a source bond pad 98 is formed on or from another portion of top surface 92, and a drain bond pad 99 is formed on or from yet another portion of top surface 92. Gate bond pad 96 and source bond pad 98 are formed on a side 104 of semiconductor chip 90 whereas drain bond pad 99 is formed on a side 106 of semiconductor chip 90. FIG. 3B is similar to FIG. 3A except that both the source and the drain bond pads are formed on the active area of the device. Thus, these pads may be much larger compared to the layout shown in FIG. 3A but does not add any significant area for the pads as they are formed on top of the active area of the device. Sides 104 and 106 are on opposite sides of semiconductor chip 90. Semiconductor chip 90 is fabricated from a compound semiconductor material such as, for example, a III-nitride semiconductor material. Thus, semiconductor chip 90 may be referred to as a III-nitride semiconductor chip, i.e., the substrate material of III-nitride semiconductor chip 90 comprises a III-nitride material such as, for example, aluminum nitride. A III-nitride semiconductor material may be referred to as a III-N semiconductor material, a III-nitride based semiconductor material, a III-N based semiconductor material, or the like. Suitable III-N materials include gallium nitride, or the like. A semiconductor chip such as, for example semiconductor chip 90 may be referred to as a semiconductor die. A semiconductor chip 90 can also be fabricated on silicon substrate.

Figure 4:
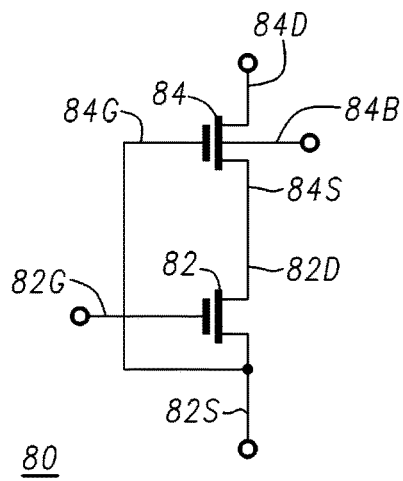
FIG. 4 is a circuit schematic of a semiconductor component in a cascode configuration, wherein a substrate of a III-N device is floating.

FIG. 4 is a circuit schematic 80 of a semiconductor component in a cascode configuration. The semiconductor component includes transistors 82 and 84, where transistor 82 has a gate electrode 82G, a source electrode 82S, and a drain electrode 82D and transistor 84 has a gate electrode 84G, a source electrode 84S, a drain electrode 84D, and a body/substrate terminal 84B. Drain electrode 82D is electrically connected to source electrode 84S and source electrode 82S is electrically connected to gate electrode 84G. Drain electrode 84D may be coupled for receiving a first source of operating potential such as, for example, a potential $V_{DD}$, for cascode semiconductor component 80, gate electrode 82G serves as an input terminal for cascoded semiconductor component 80, and source electrode 82S is coupled for receiving a second source of operating potential such as, for example potential $V_{SS}$. By way of example, potential $V_{SS}$ is ground. It should be noted that the substrate of III-N transistor 84 is floating, thus semiconductor component 80 may be referred to as being in a floating configuration or substrate floating configuration.

Figure 5:
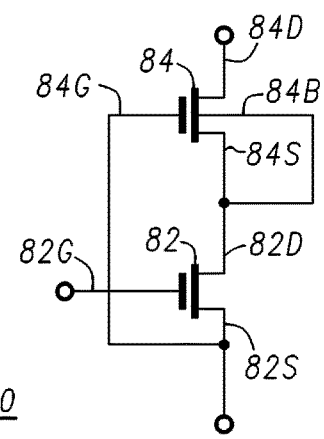
FIG. 5 is a circuit schematic of a semiconductor component in a cascode configuration, wherein a substrate of a III-N device is coupled to its source electrode.

FIG. 5 is a circuit schematic 90 of a semiconductor component in a cascode configuration. The semiconductor component includes transistors 82 and 84, where transistor 82 has a gate electrode 82G, a source electrode 82S, and a drain electrode 82D and transistor 84 has a gate electrode 84G, a source electrode 84S, a drain electrode 84D, and a body/substrate terminal 84B. Drain electrode 82D is electrically connected to source electrode 84S and source electrode 82S is electrically connected to gate electrode 84G. Drain electrode 84D may be coupled for receiving a first source of operating potential such as, for example, potential $V_{DD}$, for cascode semiconductor component 80, gate electrode 82G serves as an input terminal for cascoded semiconductor component 80, and source electrode 82S is coupled for receiving a second source of operating potential such as, for example, a potential $V_{SS}$. By way of example, potential $V_{SS}$ is a ground potential. Substrate terminal 84B of transistor 84 is electrically connected to source electrode 84S of transistor 84 and to the drain electrode of transistor 84. Thus, the substrate of transistor 84 is coupled to the same potential as source electrode 84S of transistor 84 or drain electrode 82D of transistor 82.

Figure 6:
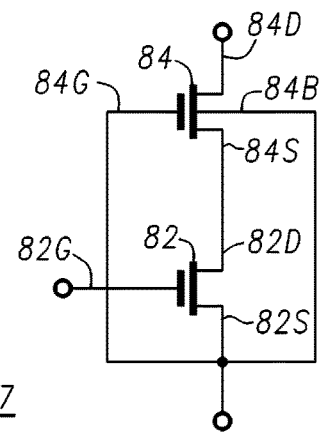
FIG. 6 is a circuit schematic of a semiconductor component in a cascode configuration, wherein a substrate of a III-N device is coupled to a source electrode of a silicon semiconductor device.

FIG. 6 is a circuit schematic 97 of a semiconductor component in a cascode configuration. The semiconductor component includes transistors 82 and 84, where transistor 82 has a gate electrode 82G, a source electrode 82S, and a drain electrode 82D and transistor 84 has a gate electrode 84G, a source electrode 84S, a drain electrode 84D, and a body/substrate terminal 84B. Drain electrode 82D of transistor 82 is electrically connected to source electrode 84S of transistor 84 and source electrode 82S of transistor 82 is electrically connected to gate electrode 84G of transistor 84. Drain electrode 84D may be coupled for receiving a first source of operating potential such as, for example potential $V_{DD}$, for cascode semiconductor component 80, gate electrode 82G serves as an input terminal for cascoded semiconductor component 80, and source electrode 82S is coupled for receiving a second source of operating potential such as for example potential $V_{SS}$. By way of example potential $V_{SS}$ is a ground potential. Substrate terminal 84B of transistor 84 is electrically connected to source electrode 82S of transistor 82. Thus, the substrate of transistor 84 is coupled to the same potential as source electrode 82S of transistor 82.

Figure 7:
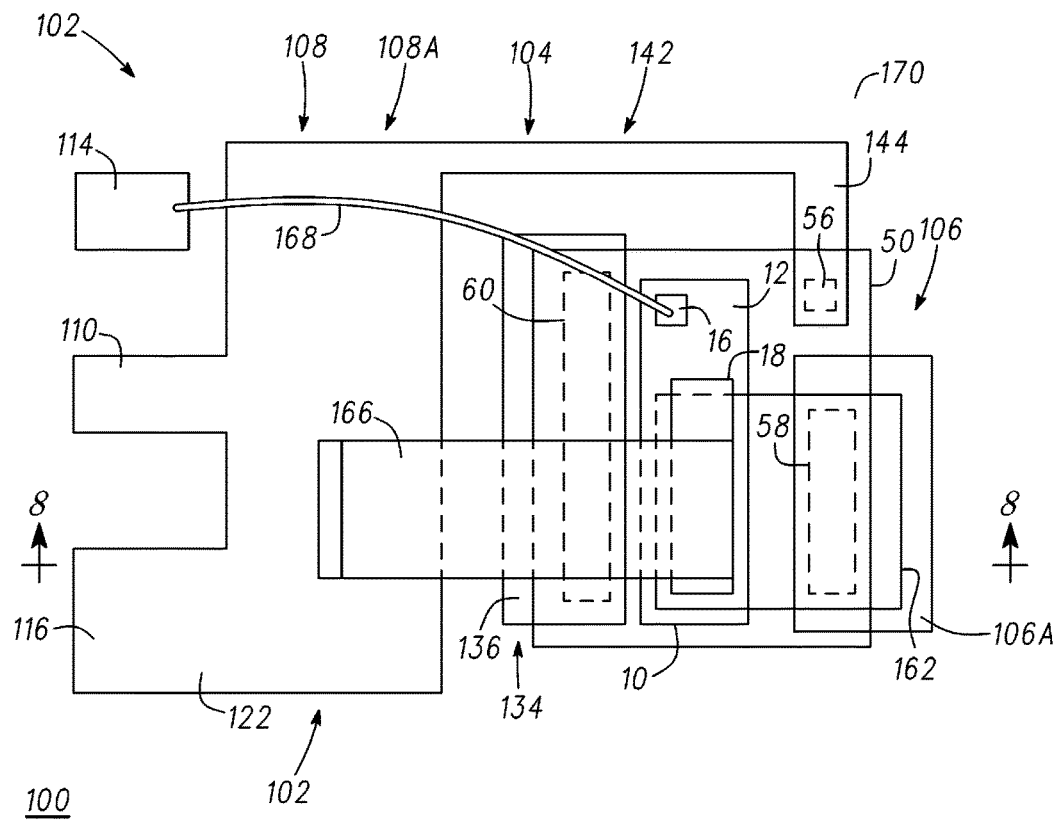
FIG. 7 is a top view of a cascode configured semiconductor component in accordance with another embodiment of the present invention.
Figure 8:
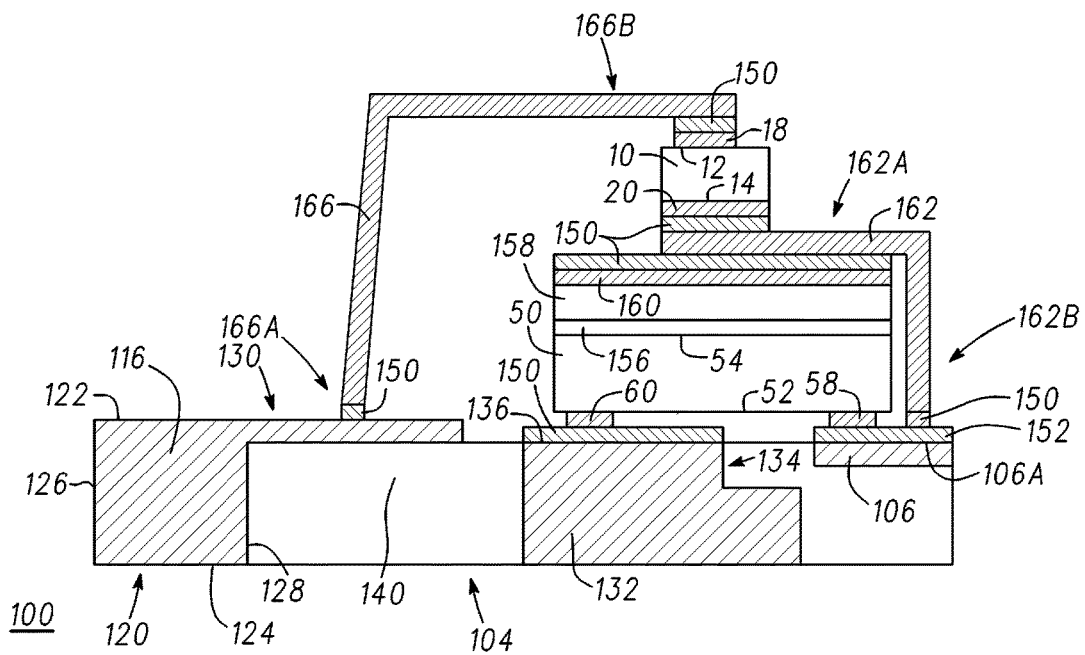
FIG. 8 is a cross-sectional view of the cascode configured semiconductor component of FIG. 7 taken along section line 8-8 of FIG. 7.

FIG. 7 is a top view of a semiconductor component 100 comprising a support 102 to which a semiconductor chip 50 is mounted in a flip-chip configuration. A semiconductor chip 10 is mounted to semiconductor chip 50. Support 102 and semiconductor chips 10 and 50 are configured for packaging in a QFN package. FIG. 8 is a cross-sectional view of semiconductor component 100 taken along section line 8-8 of FIG. 7. For the sake of clarity, FIGS. 7 and 8 are described together. More particularly, support 102 may be manufactured from an electrically conductive material such as, for example, copper. Support 102 includes device receiving portions 104 and 106 and an interconnect portion 108. In a top view, interconnect portion 108 is an electrically conductive "F" shaped structure having a rectangularly shaped body 108A from which a source lead 116 extends and a Kelvin lead 110 extends. Thus, source lead 116 and Kelvin lead 110 are integrally formed with and extend from interconnect portion 108. In accordance with an embodiment, Kelvin lead 110 extends from a central region of rectangularly shaped body 108A and source lead 116 extends from an end region of rectangularly shaped body 108A. It should be noted that source lead 116 is shown as being wider than Kelvin lead 110, however this is not a limitation of the present invention. For example, source lead 116 and Kelvin lead 110 can have the same width or Kelvin lead 110 can be wider than source lead 116. A gate lead 114 is formed adjacent to and electrically isolated from support 102.

In a cross-sectional view of support 102, interconnect portion 108 has a rectangularly shaped base structure 120 having surfaces 122 and 124, edges 126 and 128 and an arm or extension 130 extending from edge 128 adjacent surface 122. Device receiving portion 104 having a base 132 from which a pedestal 134 extends. In accordance with an embodiment, pedestal 134 has a surface 136 that is in substantially the same plane as surface 122. Device receiving portion 106 is a rectangularly shaped portion having a surface 106A that is in substantially the same plane as surfaces 122 and 136. A thermally enhanced mold compound 140 is between extension 130 and pedestal 134 and between extension 130 and a portion of base 132. In addition, thermally enhanced mold compound 140 is between pedestal 134 and device receiving portion 106. Alternatively, a ceramic material may be positioned under extension 130 and under device receiving portion 106 to provide additional support.

Support 102 further includes an extension 142 extending from rectangularly shaped body 108A. Extension 142 has a gate interconnect portion 144.

A bonding agent 150 is formed on surface 136 and a bonding agent 152 is formed on surface 106A. Drain bond pad 60 of III-N semiconductor device 50 is bonded to pedestal 134 through bonding agent 150 and source bond pad 58 is bonded to surface 106A of device receiving portion 106 through bonding agent 152. Suitable materials for bonding agents 150 and 152 include solder, electrically conductive epoxy, or the like.

A die attach material 156 is formed on surface 54 of III-N semiconductor device 50 and an electrically insulating material 158 is mounted to die attach material 156. By way of example, electrically insulating material 158 is ceramic. A bondable layer 160 is formed on ceramic layer 158 and a bonding agent 150 is formed on bondable layer 160, which bondable layer 160 may be, for example, copper. An electrically conductive interconnect 162 is connected between bondable layer 160 and device receiving portion 106. More particularly, electrically conductive interconnect 162 is a clip having a terminal 162A and a terminal 162B, where terminal 162A is bonded to bondable layer 160 through bonding agent 150 and terminal 162B is bonded to device receiving portion 106 through bonding agent 150. A bonding agent 150 is formed on terminal 162A of clip 162 and drain electrode 20 of silicon based semiconductor chip 10 is bonded to clip 162. Thus, clip 162 electrically connects the drain electrode of silicon based semiconductor chip 10 to source bond pad 60 of III-N based semiconductor chip 50 through bonding agent 50 and bonding agent 152.

Source bond pad 18 of silicon based semiconductor chip 10 is electrically connected to interconnect portion 108 through an electrically conductive interconnect 166. More particularly, electrically conductive interconnect 166 is a clip having a terminal 166A and a terminal 166B, where terminal 166A is bonded to interconnect portion 108 through bonding agent 150 and terminal 166B is bonded to source bond pad 18 through bonding agent 150.

Gate bond pad 16 of silicon semiconductor device 10 is electrically connected to gate lead 114 by a bond wire 168. Bond wire 168 may be referred to as a bonding wire or a wirebond.

As those skilled in the art are aware, support 102, including device receiving portions 104 and 106, interconnect portion 108, semiconductor chips 10 and 50, and electrically conductive interconnects 162 and 166 may be encapsulated in a protective material such as, for example a mold compound (not shown). It should be noted that after encapsulation, Kelvin lead 110, source lead 116, and gate lead 114 extend from the mold compound. In accordance with an embodiment, the mold compound is a thermally enhanced mold compound. It should be noted that mold compound 140 may be a portion of the mold compound that encapsulates support 102, including device receiving portions 104 and 106, interconnect portion 108, semiconductor chips 10 and 50, and electrically conductive interconnects 162 and 166.

Semiconductor component 100 may be represented schematically by circuit schematic 80 of FIG. 4, where transistor 84 of FIG. 4 represents III-N transistor 50 of FIGS. 7 and 8 and transistor 82 of FIG. 4 represents silicon transistor 10 of FIGS. 7 and 8. Thus, the substrate material, i.e., the substrate, of III-N transistor 50 of semiconductor component 100 is electrically isolated from the source lead 116, the drain lead 132, and the gate lead 114 of semiconductor component 100 and thus is floating. It should be appreciated that semiconductor component 100 is in a QFN package. It should be further appreciated that semiconductor chip 50 can be replaced with semiconductor chip 90 so that bonds may be formed over active areas of the semiconductor chip 90. As discussed above, placing the bond pads over an active area increases the contact area, reduces cost, and improves thermal performance.

Figure 9:
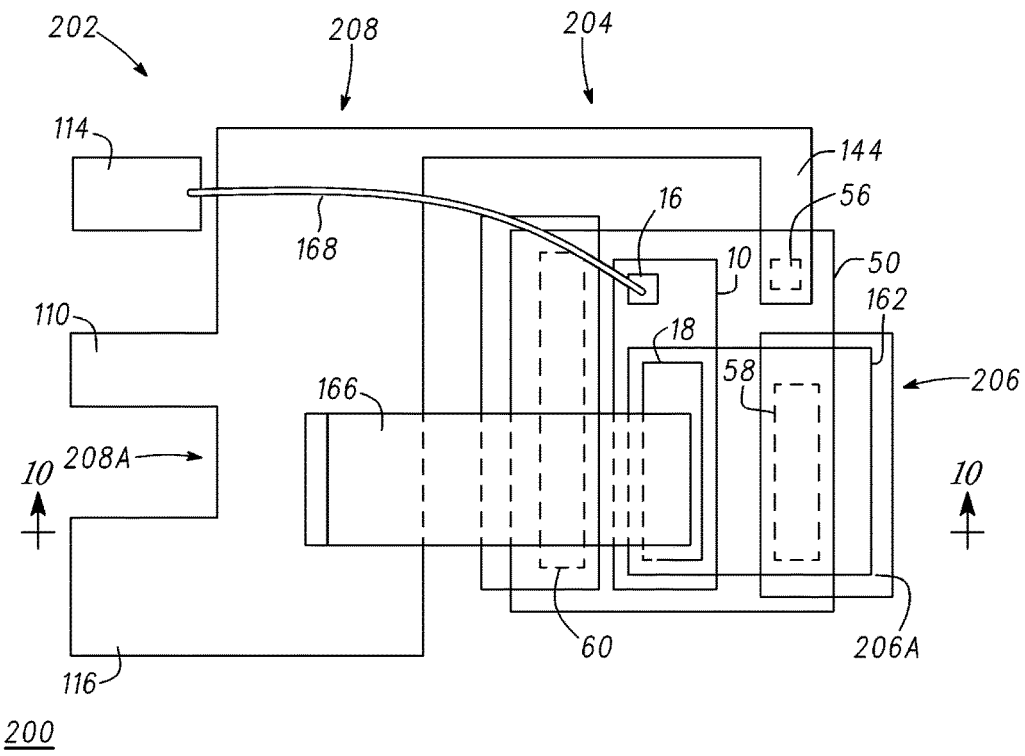
FIG. 9 is a top view of a cascode configured semiconductor component in accordance with another embodiment of the present invention.
Figure 10:
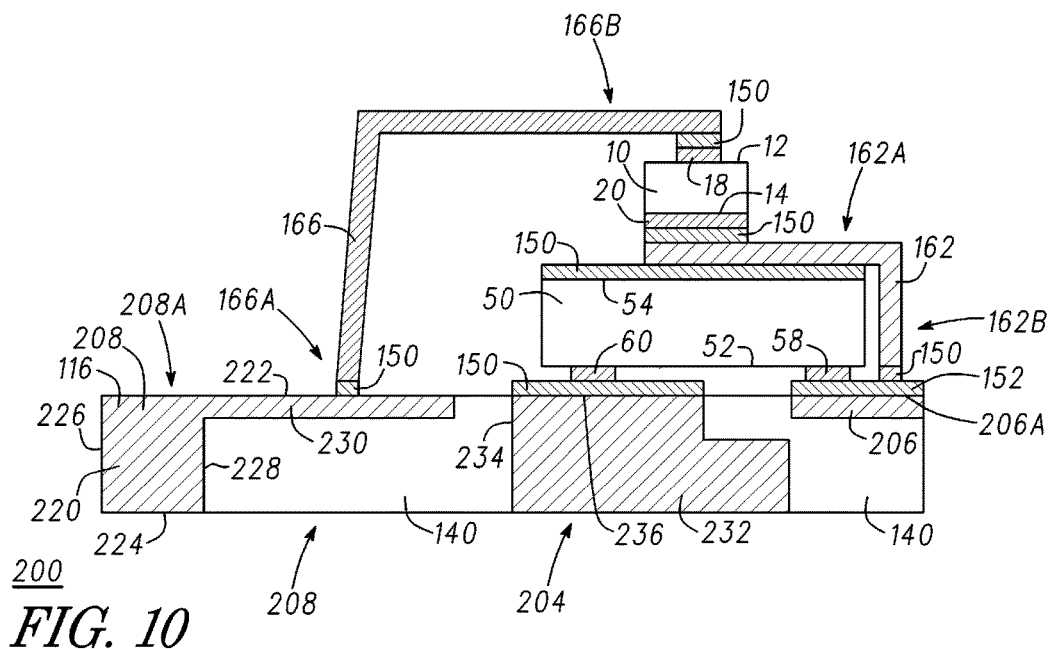
FIG. 10 is a cross-sectional view of the cascode configured semiconductor component of FIG. 9 taken along section line 10-10 of FIG. 9.

FIG. 9 is a top view of a semiconductor component 200 comprising a support 202 to which a semiconductor chip 50 is mounted in a flip-chip configuration. A semiconductor chip 10 is mounted to semiconductor chip 50. Support 202 and semiconductor chips 10 and 50 are configured for packaging in a QFN package. FIG. 10 is a cross-sectional view of semiconductor component 200 taken along section line 10-10 of FIG. 9. For the sake of clarity, FIGS. 9 and 10 are described together. Support 202 may be manufactured from an electrically conductive material such as, for example, copper. Support 202 includes device receiving portions 204 and 206 and an interconnect portion 208. In a top view, interconnect portion 208 is an electrically conductive "F" shaped structure having a rectangularly shaped body 208A from which a source lead 116 extends and a Kelvin lead 110 extends. Thus, source lead 116 and Kelvin lead 110 are integrally formed with and extend from interconnect portion 208. In accordance with an embodiment, Kelvin lead 110 extends from a central region of rectangularly shaped body 208A and source lead 116 extends from an end region of rectangularly shaped body 208A. It should be noted that source lead 116 is shown as being wider than Kelvin lead 110, however this is not a limitation of the present invention. For example, source lead 116 and Kelvin lead 110 can have the same width or Kelvin lead 110 can be wider than source lead 116. A gate lead 114 is formed adjacent to and electrically isolated from support 202.

In a cross-sectional view of support 202, interconnect portion 208 has a rectangularly shaped base structure 220 having surfaces 222 and 224, edges 226 and 228 and an arm or extension 230 extending from edge 228 adjacent surface 222. Device receiving portion 204 is an "L" shaped structure having a base 232 from which a pedestal 234 extends. In accordance with an embodiment, pedestal 234 has a surface 236 that is in substantially the same plane as surface 222. Device receiving portion 206 is a rectangularly shaped portion having a surface 206A that is in substantially the same plane as surfaces 222 and 236. A thermally enhanced mold compound 140 is between extension 230 and pedestal 234 and between extension 230 and a portion of base 232.

In addition, thermally enhanced mold compound 140 is between pedestal 234 and device receiving portion 206. Alternatively, a ceramic material may be positioned under extension 230 and under device receiving portion 206 to provide additional support.

A bonding agent 150 is formed on surface 236 and a bonding agent 152 is formed on surface 206A. Drain bond pad 60 of III-N semiconductor device 50 is bonded to pedestal 234 through bonding agent 150 and source bond pad 58 is bonded to surface 206A of device receiving portion 206 through bonding agent 152. Suitable materials for bonding agents 150 and 152 include solder, electrically conductive epoxy, or the like.

Bonding agent 150 is formed on surface 54 of III-N semiconductor device 50. An electrically conductive interconnect 162 is connected between surface 54 and surface 206A. More particularly, electrically conductive interconnect 162 is a clip having a terminal 162A and a terminal 162B, where terminal 162A is bonded to surface 54 using a bonding agent 150 and terminal 162B is bonded to surface 206A using bonding agents 150 and 152. A bonding agent 150 is formed on terminal 162A of clip 162 and drain electrode 20 of silicon based semiconductor chip 10 is bonded to clip 162. Thus, clip 162 electrically connects drain electrode 20 of silicon based semiconductor chip 10 to source bond pad 58 of III-N based semiconductor chip 50 and to surface 54 of semiconductor chip 50. Thus, clip 162 electrically connects drain contact 20 of silicon based semiconductor chip 10 to the substrate of semiconductor chip 50.

Source bond pad 18 of silicon based semiconductor chip 10 is electrically connected to interconnect portion 208 through an electrically conductive interconnect 166. More particularly, electrically conductive interconnect 166 is a clip having a terminal 166A and a terminal 166B, where terminal 166A is bonded to interconnect portion 208 through bonding agent 150 and terminal 166B is bonded to source bond pad 18 through bonding agent 150.

Gate bond pad 16 of silicon semiconductor device 10 is electrically connected to gate lead 114 by a bond wire 168. Bond wire 168 may be referred to as a bonding wire or a wirebond.

As those skilled in the art are aware, support 202, including device receiving portions 204 and 206, interconnect portion 208, semiconductor chips 10 and 50 and electrically conductive interconnects 162 and 166 may be encapsulated in a protection material such as, for example a mold compound. Mold compound 140 may be formed from a portion of the protection material. It should be noted that after encapsulation, Kelvin lead 110, source lead 116, and gate lead 114 extend from the mold compound. In accordance with an embodiment, the mold compound is a thermally enhanced mold compound. It should be noted that mold compound 140 may be a portion of the mold compound that encapsulates support 202, including device receiving portions 204 and 206, interconnect portion 208, semiconductor chips 10 and 50 and electrically conductive interconnects 162 and 166.

Semiconductor component 200 may be represented schematically by circuit schematic 90 of FIG. 5, where transistor 84 of FIG. 5 represents III-N transistor 50 of FIGS. 9 and 10 and transistor 82 of FIG. 5 represents silicon transistor 10 of FIGS. 9 and 1. Thus, the substrate material, i.e., the substrate, of III-N transistor 50 of semiconductor component 100 is electrically coupled to drain of the silicon based transistor 10 and to the source of the III-N transistor 50. The drain of silicon based transistor 10, the source of the III-N transistor 50, and the substrate material of III-N transistor 50 are at the same potential. Thus, the substrate material, i.e., the substrate, of III-N transistor 50 of semiconductor component 200 is electrically isolated from the source lead 116, the drain lead 232, and the gate lead 114 of semiconductor component 200. It should be appreciated that semiconductor component 200 is in a QFN package. It should be further appreciated that semiconductor chip 50 can be replaced with semiconductor chip 90 so that bonds may be formed over active areas of the semiconductor chip 90. As discussed above, placing the bond pads over an active area increases the contact area, reduces cost, and improves thermal performance.

Figure 11:
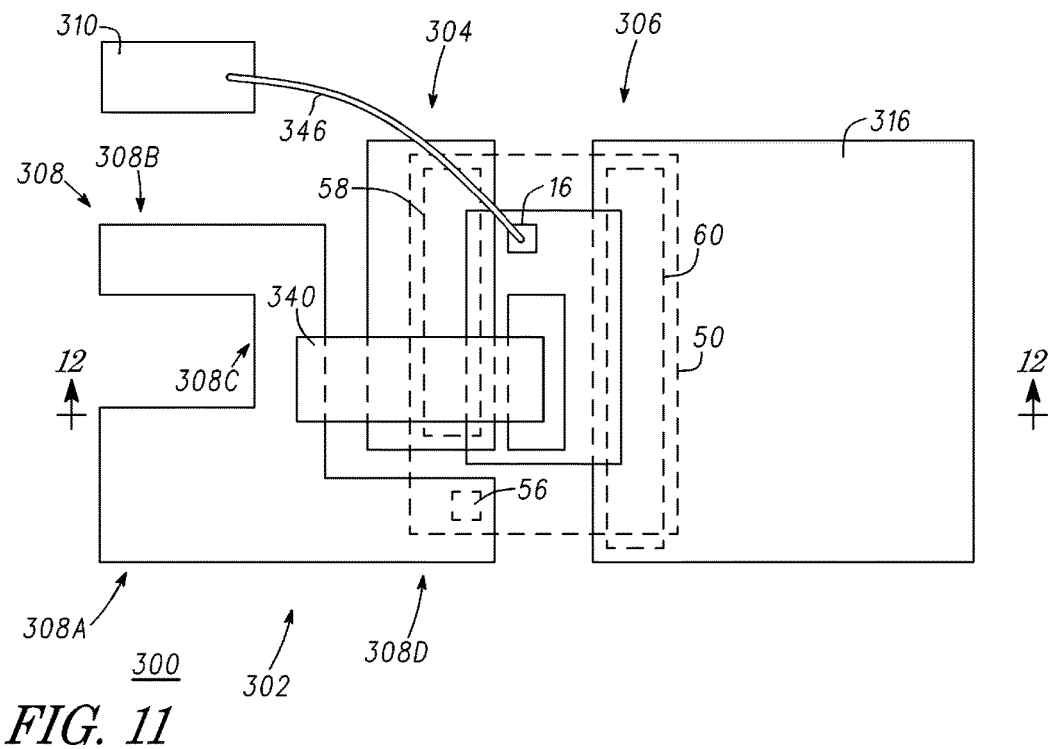
FIG. 11 is a top view of a cascode configured semiconductor component in accordance with another embodiment of the present invention.
Figure 12:
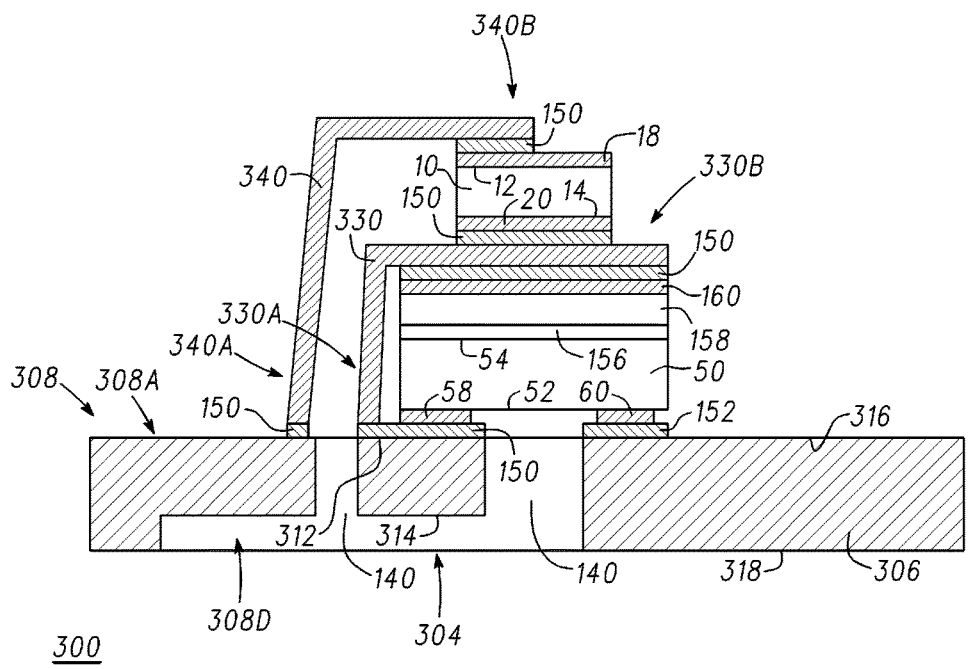
FIG. 12 is a cross-sectional view of the cascode configured semiconductor component of FIG. 11 taken along section line 12-12 of FIG. 11.

FIG. 11 is a top view of a semiconductor component 300 comprising a support 302 to which a semiconductor chip 50 is mounted in a flip-chip configuration. A semiconductor chip 10 is mounted to semiconductor chip 50. Support 302 and semiconductor chips 10 and 50 are configured for packaging in a QFN package. FIG. 12 is a cross-sectional view of semiconductor component 300 taken along section line 12-12 of FIG. 11. For the sake of clarity, FIGS. 11 and 12 are described together. More particularly, support 302 may be manufactured from an electrically conductive material such as, for example, copper. Support 302 includes device receiving portions 304 and 306 and an interconnect portion 308. In a top view, interconnect portion 308 has a rectangular shaped portion 308A electrically connected to a rectangularly shaped portion 308B by a conductive strip 308C. Rectangular shaped portion 308A has an extension 308D extending from a side, wherein rectangular shaped portion 308A serves as a source lead. Extension 308D is configured for bonding to a gate bond pad 56 of semiconductor chip 50. Rectangular shaped portion 308B serves as a Kelvin probe. Semiconductor component 300 further includes a rectangularly shaped electrically conductive structure 310 that is electrically isolated from interconnect portion 308 and device receiving portions 304 and 306. Electrically conductive structure 310 serves as a gate lead.

In accordance with an embodiment, the top and side views of device receiving portion 304 illustrate a rectangular structure. Thus, device receiving portion 304 has a cubic shape having surface 312 and 314. Likewise, a top view of device receiving portion 306 illustrates a polygonal structure such as, for example, a rectangle or a square, and a side view illustrates a polygonal structure such as a rectangle or square. Thus, device receiving portion 306 has a cubic shape having surfaces 316 and 318. Device receiving portion 304 is thinner than, i.e., not as thick as, device receiving portion 306. Alternatively, device receiving portion 304 may have the same thickness as device receiving portion 306 or may be thicker than device receiving portion 306.

A thermally enhanced mold compound 140 is between interconnect portion 308 and device receiving portion 304 and between device receiving portion 304 and device receiving portion 306. Mold compound 140 is adjacent surface 314 and below extension 308D. Alternatively, a ceramic material may be positioned under extension 308D and under device receiving portion 304 to provide additional support.

A bonding agent 150 is formed on surface 312 and a bonding agent 152 is formed on a portion of the surface 316. Source bond pad 58 of III-N semiconductor device 50 is bonded to device receiving portion 304 through bonding agent 150 and drain bond pad 60 is bonded to surface 316 of device receiving portion 306 through bonding agent 152. Gate bond pad 56 of III-N semiconductor device 50 is bonded to extension 308D of interconnect portion 308. Suitable materials for bonding agents 150 and 152 include solder, electrically conductive epoxy, or the like.

A die attach material 156 is formed on surface 54 of III-N semiconductor device 50 and an electrically insulating material 158 is mounted to die attach material 156. By way of example, electrically insulating material 158 is ceramic. A bondable layer 160 is formed on ceramic 158 and a bonding agent 150 is formed on bondable layer 160. By way of example, bondable layer 160 is solder. An electrically conductive interconnect 330 is connected between device receiving portion 304 and bondable layer 160. By way of example, electrically conductive interconnect 330 is a clip having a terminal 330A and a terminal 330B, where terminal 330A is bonded to device receiving portion 304 through bonding agent 150 and terminal 330B is bonded to bondable layer 160. A bonding agent 150 is formed on terminal 330B of clip 330 and drain electrode 20 of silicon based semiconductor chip 10 is bonded to clip 330. Thus, clip 330 electrically connects drain electrode 20 of silicon based semiconductor chip 10 to source bond pad 58 of III-N based semiconductor chip 50.

Source bond pad 18 of silicon based semiconductor chip 10 is electrically connected to interconnect portion 308 through an electrically conductive interconnect 340. By way of example, electrically conductive interconnect 340 is a clip having a terminal 340A and a terminal 340B, where terminal 340A is bonded to interconnect portion 308 through bonding agent 150 and terminal 340B is bonded to source bond pad 18 through bonding agent 150.

Gate bond pad 16 of silicon semiconductor device 10 is electrically connected to gate lead 310 by a bond wire 346. Bond wire 346 may be referred to as a bonding wire or a wirebond.

As those skilled in the art are aware, support 302, including device receiving portions 304 and 306, interconnect 308, semiconductor chips 10 and 50, and electrically conductive interconnects 330 and 340 may be encapsulated in a protection material such as, for example a mold compound (not shown). It should be noted that after encapsulation, source lead 308A, Kelvin lead 308B, and gate lead 310 extend from the mold compound. In accordance with an embodiment, the mold compound is a thermally enhanced mold compound. It should be noted that mold compound 140 may be a portion of the mold compound that encapsulates support 302, including device receiving portions 304 and 306, interconnect 308, semiconductor chips 10 and 50, and electrically conductive interconnects 330 and 340.

Semiconductor component 300 may be represented schematically by circuit schematic 80 of FIG. 4, where transistor 84 of FIG. 4 represents III-N transistor 50 of FIGS. 11 and 12 and transistor 82 of FIG. 4 represents silicon transistor 10 of FIGS. 11 and 12. Thus, the substrate material, i.e., the substrate, of III-N transistor 50 of semiconductor component 300 is electrically isolated from the source lead 308A, drain lead 306, and gate lead 310 of semiconductor component 300 and thus is floating. It should be appreciated that semiconductor component 300 is in a QFN package. It should be further appreciated that semiconductor chip 50 can be replaced with semiconductor chip 90 so that bonds may be formed over active areas of the semiconductor chip 90. As discussed above, placing the bond pads over an active area increases the contact area, reduces cost, and improves thermal performance.

Figure 13:
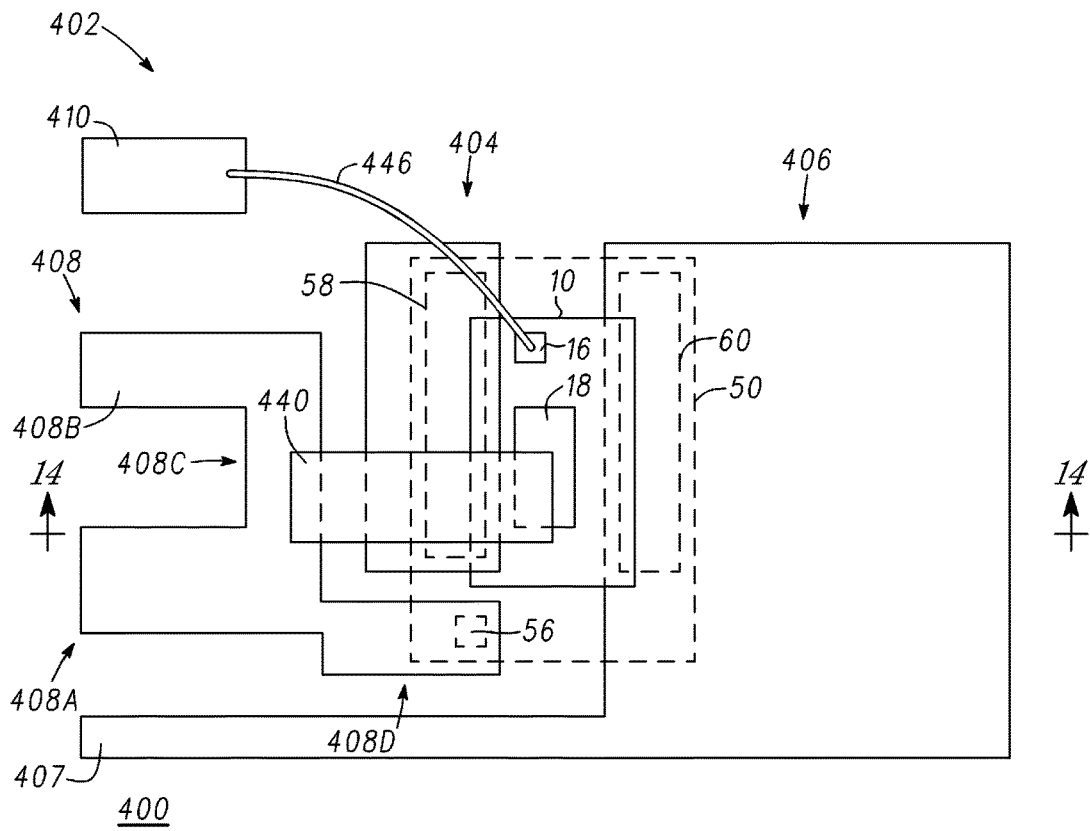
FIG. 13 is a top view of a cascode configured semiconductor component in accordance with another embodiment of the present invention.
Figure 14:
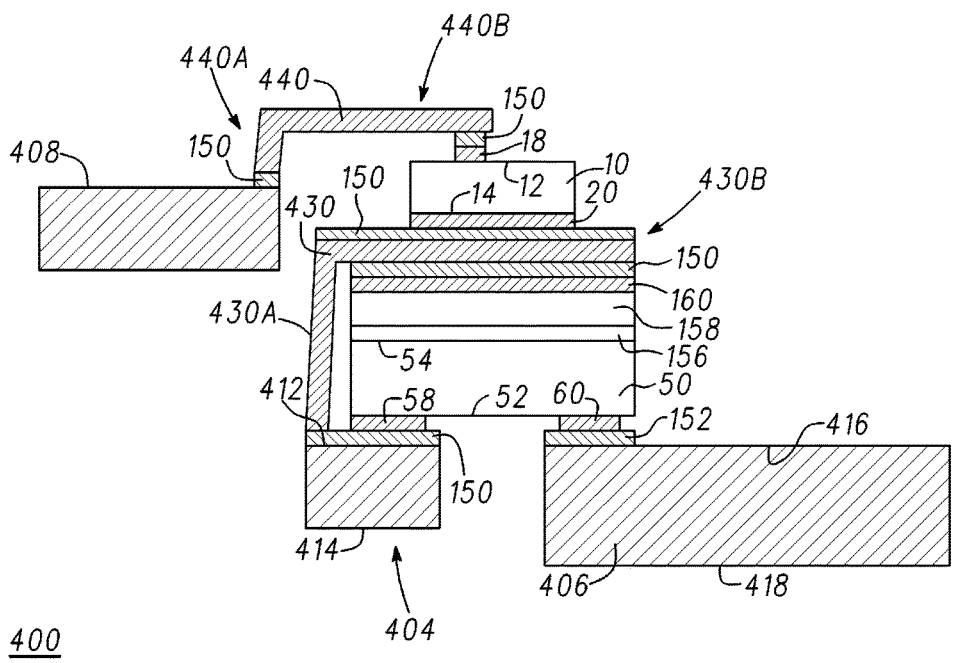
FIG. 14 is a cross-sectional view of the cascode configured semiconductor component of FIG. 13 taken along section line 14-14 of FIG. 13.

FIG. 13 is a top view of a semiconductor component 400 comprising a support 402 to which a semiconductor chip 50 is mounted in a flip-chip configuration. A semiconductor chip 10 is mounted to semiconductor chip 50. Support 402 and semiconductor chips 10 and 50 are configured for packaging in a through hole package. FIG. 14 is a cross-sectional view of semiconductor component 400 taken along section line 14-14 of FIG. 13. For the sake of clarity, FIGS. 13 and 14 are described together. More particularly, support 402 may be manufactured from an electrically conductive material such as, for example, copper. Support 402 includes device receiving portions 404 and 406 and an interconnect portion 408. In a top view, interconnect portion 408 has a rectangular shaped portion 408A electrically connected to a rectangularly shaped portion 408B by a conductive strip 408C. Rectangular shaped portion 408A has an extension 408D extending from a side, wherein rectangular shaped portion 408A serves as a source lead. Extension 408D is configured for bonding to a gate bond pad 56 of semiconductor chip 50. Rectangular shaped portion 408B serves as a Kelvin probe. Semiconductor component 400 further includes a rectangularly shaped electrically conductive structure 410 that is electrically isolated from interconnect portion 408 and device receiving portions 404 and 406. Electrically conductive structure 410 serves as a gate lead.

In accordance with an embodiment, top and side views of device receiving portion 404 illustrate a rectangular structure. Thus, device receiving portion 404 has a cubic shape having surfaces 412 and 414. Likewise, a top view of device receiving portion 406 illustrates a polygonal structure such as, for example, a rectangle or a square, and a side view illustrates a polygonal structure such as a rectangle or square. Thus, device receiving portion 406 has a cubic shape having surfaces 416 and 418. Device receiving portion 404 is thinner than, i.e., not as thick as, device receiving portion 406. Alternatively, device receiving portion 404 may have the same thickness as device receiving portion 406 or may have a greater thickness than device receiving portion 406. Device receiving portion 406 has an extension 407 that extends from a side of device receiving portion 406 so that a portion of extension 407 is adjacent to but electrically isolated from interconnect portion 408. Extension 407 serves as a drain lead.

A thermally enhanced mold compound (not shown) is between interconnect portion 408 and device receiving portion 404 and between device receiving portion 404 and device receiving portion 406. The mold compound is adjacent to surface 414 and below extension 408D. Alternatively, a ceramic material may be positioned under extension 408D and under device receiving portion 404 to provide additional support.

A bonding agent 150 is formed on surface 412 and a bonding agent 152 is formed on surface 416. Source bond pad 58 of III-N semiconductor device 50 is bonded to device receiving portion 404 through bonding agent 150 and drain bond pad 60 is bonded to surface 416 of device receiving portion 406 through bonding agent 152. Gate bond pad 56 of III-N semiconductor device 50 is bonded to extension 408D of interconnect portion 408. Suitable materials for bonding agents 150 and 152 include solder, electrically conductive epoxy, or the like.

A die attach material 156 is formed on surface 54 of III-N semiconductor device 50 and an electrically insulating material 158 is mounted to die attach material 156. By way of example, electrically insulating material 158 is ceramic. A bondable layer 160 is formed on ceramic 158 and a bonding agent 150 is formed on bondable layer 160. By way of example, bondable layer 160 is copper. An electrically conductive interconnect 430 is connected between bondable layer 160 and device receiving portion 404. By way of example, electrically conductive interconnect 430 is a clip having a terminal 430A and a terminal 430B, where terminal 430A is bonded to die receiving portion 404 through bonding agent 150 and terminal 430B is bonded to bondable layer 160. A bonding agent 150 is formed on terminal 430B of clip 430 and drain electrode 20 of silicon based semiconductor chip 10 is bonded to clip 430. Thus, clip 430 electrically connects the drain electrode of silicon based semiconductor chip 10 to source bond pad 58 of III-N based semiconductor chip 50.

Source bond pad 18 of silicon based semiconductor chip 10 is electrically connected to interconnect portion 408 through an electrically conductive interconnect 440. By way of example, electrically conductive interconnect 440 is a clip having a terminal 440A and a terminal 440B, where terminal 440A is bonded to interconnect portion 408 through bonding agent 150 and terminal 440B is bonded to source bond pad 18 through bonding agent 150.

Gate bond pad 16 of silicon semiconductor device 10 is electrically connected to gate lead 410 by a bond wire 446. Bond wire 446 may be referred to as a bonding wire or a wirebond.

As those skilled in the art are aware, support 402, including device receiving portions 404 and 406, interconnect 408, semiconductor chips 10 and 50, and electrically conductive interconnects 430 and 440 may be encapsulated in a protection material such as, for example a mold compound. It should be noted that after encapsulation, drain lead 407, source lead 408A, Kelvin lead 408B, and gate lead 410 extend from the mold compound. In accordance with an embodiment, the mold compound is a thermally enhanced mold compound. It should be appreciated that the mold compound between interconnect portion 408 and device receiving portion 404 and between device receiving portion 404 and device receiving portion 406 may be a portion of the mold compound that serves as the protection material of semiconductor component 400.

Semiconductor component 400 may be represented schematically by circuit schematic 80 of FIG. 4, where transistor 84 of FIG. 4 represents III-N transistor 50 of FIGS. 13 and 14 and transistor 82 of FIG. 4 represents silicon transistor 10 of FIGS. 13 and 14. Thus, the substrate material, i.e., the substrate, of III-N transistor 50 of semiconductor component 400 is electrically isolated from the source lead 408A, the drain lead 407, and the gate lead 114 of semiconductor component 400 and thus is floating. It should be appreciated that semiconductor component 400 is in a through hole package and that support 402 conforms with through hole package outlines such as, for example, a TO-220 outline, a TO-247 outline, a TO-264 outline, a TO-257 outline, or the like. It should be further appreciated that semiconductor chip 50 can be replaced with semiconductor chip 90 so that bonds may be formed over active areas of the semiconductor chip 90. As discussed above, placing the bond pads over an active area increases the contact area, reduces cost, and improves thermal performance.

Figure 15:
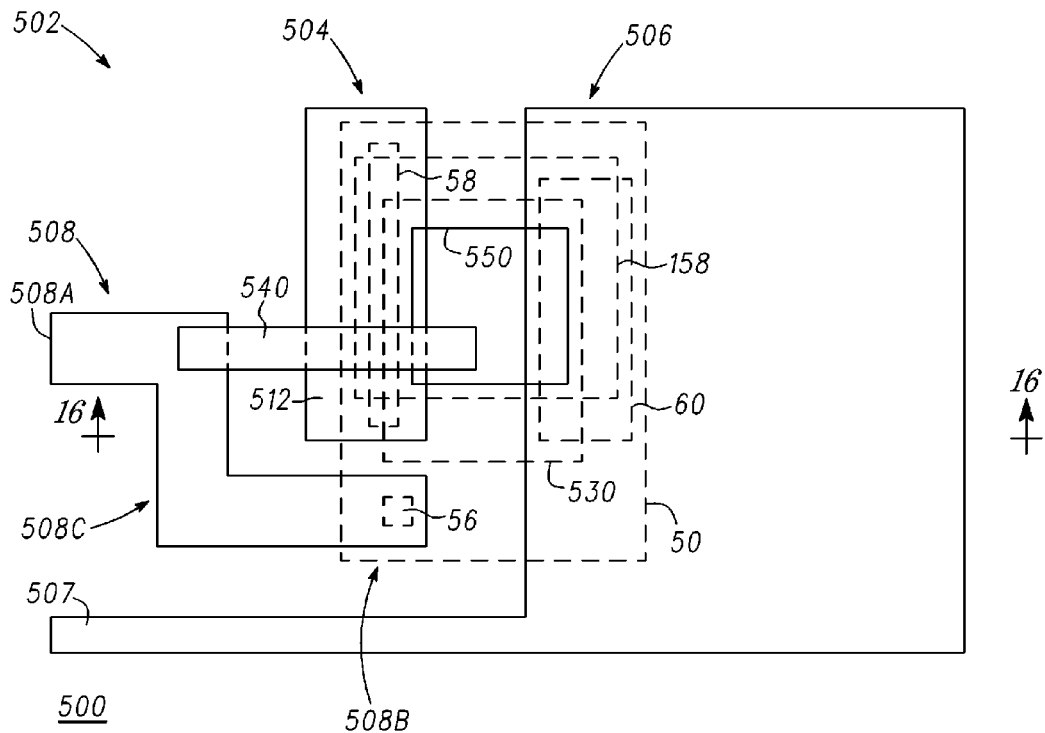
FIG. 15 is a top view of a cascode configured semiconductor component in accordance with another embodiment of the present invention.
Figure 16:
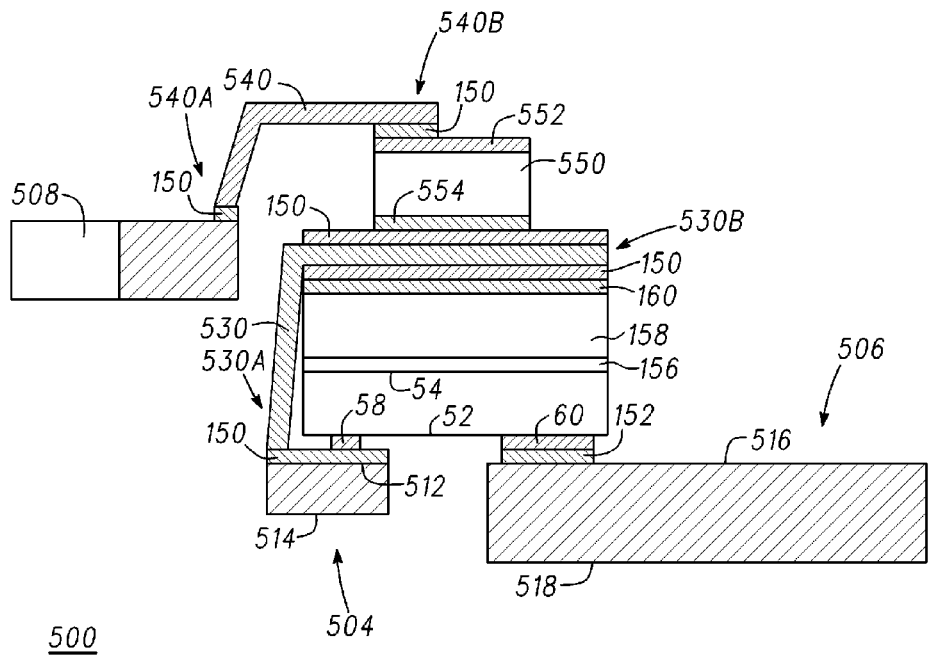
FIG. 16 is a cross-sectional view of the cascode configured semiconductor component of FIG. 15 taken along section line 16-16 of FIG. 15.

FIG. 15 is a top view of a semiconductor component 500 comprising a support 502 to which a semiconductor chip 50 is mounted in a flip-chip configuration. A semiconductor chip 550 is mounted to semiconductor chip 50. Support 502 and semiconductor chips 10 and 50 are configured for packaging in a through hole package. FIG. 15 is a cross-sectional view of semiconductor component 500 taken along section line 16-16 of FIG. 15. For the sake of clarity, FIGS. 14 and 15 are described together. More particularly, support 502 may be manufactured from an electrically conductive material such as, for example, copper. Support 502 includes device receiving portions 504 and 506 and an interconnect portion 508. In a top view, interconnect portion 508 includes a rectangular shaped portion 508A electrically connected to a rectangularly shaped portion 508B by a conductive strip 508C. Rectangular shaped portion 508A serves as an anode lead.

In accordance with an embodiment, the top and side views of device receiving portion 504 illustrate a rectangular structure. Thus, device receiving portion 504 has a cubic shape having surfaces 512 and 514. Likewise, a top view of device receiving portion 506 illustrates a polygonal structure such as, for example, a rectangle or a square, and a side view illustrates a polygonal structure such as, for example, a rectangle or square. Thus, device receiving portion 506 has a cubic shape having surfaces 516 and 518. It should be noted that device receiving portion 504 is thinner than, i.e., not as thick as, device receiving portion 506. Device receiving portion 506 has an extension 507 that extends from a side of device receiving portion 506 so that a portion of extension 507 is adjacent to but electrically isolated from interconnect portion 508. Extension 507 serves as a cathode lead.

A thermally enhanced mold compound (not shown) is between interconnect portion 508 and device receiving portion 504 and between device receiving portion 504 and device receiving portion 506. The mold compound is adjacent to surface 514 and below extension 508C. Alternatively, a ceramic material may be positioned under extension 508C and under device receiving portion 504 to provide additional support.

A bonding agent 150 is formed on surface 512 and a bonding agent 152 is formed on surface 516. Source bond pad 58 of III-N semiconductor device 50 is bonded to device receiving portion 504 through bonding agent 150 and drain bond pad 60 is bonded to surface 516 of device receiving portion 506 through bonding agent 152. Gate bond pad 56 of III-N semiconductor device 50 is bonded to anode lead 508. Suitable materials for bonding agents 150 and 152 include solder, electrically conductive epoxy, or the like.

A die attach material 156 is formed on surface 54 of III-N semiconductor device 50 and an electrically insulating material 158 is mounted to die attach material 156. By way of example, electrically insulating material 158 is ceramic. A bondable layer 160 is formed on ceramic 158 and a bonding agent 150 is formed on bondable layer 160. By way of example, bondable layer 160 is solder. An electrically conductive interconnect 530 is connected between bondable layer 160 and device receiving portion 506. By way of example, electrically conductive interconnect 530 is a clip having a terminal 530A and a terminal 530B, where terminal 530A is bonded to die receiving portion 504 through bonding agent 150 and terminal 530B is bonded to bondable layer 160. A bonding agent 150 is formed on terminal 530B of clip 530 and a cathode 554 of a semiconductor chip 550 is bonded to clip 530. Thus, clip 530 electrically connects cathode 554 of semiconductor chip 550 to source bond pad 58 of III-N based semiconductor chip 50. It should be noted that a diode is formed from semiconductor chip 550, where the diode has an anode 552 on a surface of a semiconductor material of the diode and a cathode 554 on an opposing surface of the semiconductor material of the diode.

Anode 552 of semiconductor chip 550 is electrically connected to interconnect portion 508 through an electrically conductive interconnect 540. By way of example, electrically conductive interconnect 540 is a clip having a terminal 540A and a terminal MOB, where terminal 540A is bonded to interconnect portion 508 through bonding agent 150 and terminal 540B is bonded to anode 552 of semiconductor chip 550 through bonding agent 150.

As those skilled in the art are aware, support 502, including device receiving portions 504 and 506, interconnect 508, semiconductor chips 50 and 550, and electrically conductive interconnects 530 and 540 may be encapsulated in a protection material such as, for example a mold compound. It should be noted that after encapsulation, cathode lead 507 and anode lead 508 extend from the mold compound. In accordance with an embodiment, the mold compound is a thermally enhanced mold compound. It should be noted that the mold compound between interconnect portion 508 and device receiving portion 504 and between device receiving portion 504 and device receiving portion 506 may be a portion of the mold compound that serves as the protection material of semiconductor component 500.

It should be further noted that the substrate material, i.e., substrate, of III-N transistor 50 of semiconductor component 500 is electrically isolated from leads 507 and 508 of semiconductor component 500 and thus is floating. It should be appreciated that semiconductor component 500 is in a through hole package and that support 502 conforms with through hole package outlines such as, for example, a TO-220 outline, a TO-247 outline, a TO-264 outline, a TO-257 outline, or the like. It should be further appreciated that semiconductor chip 50 can be replaced with semiconductor chip 90 so that bonds may be formed over active areas of the semiconductor chip 90. As discussed above, placing the bond pads over an active area increases the contact area, reduces cost, and improves thermal performance.

Figure 17:
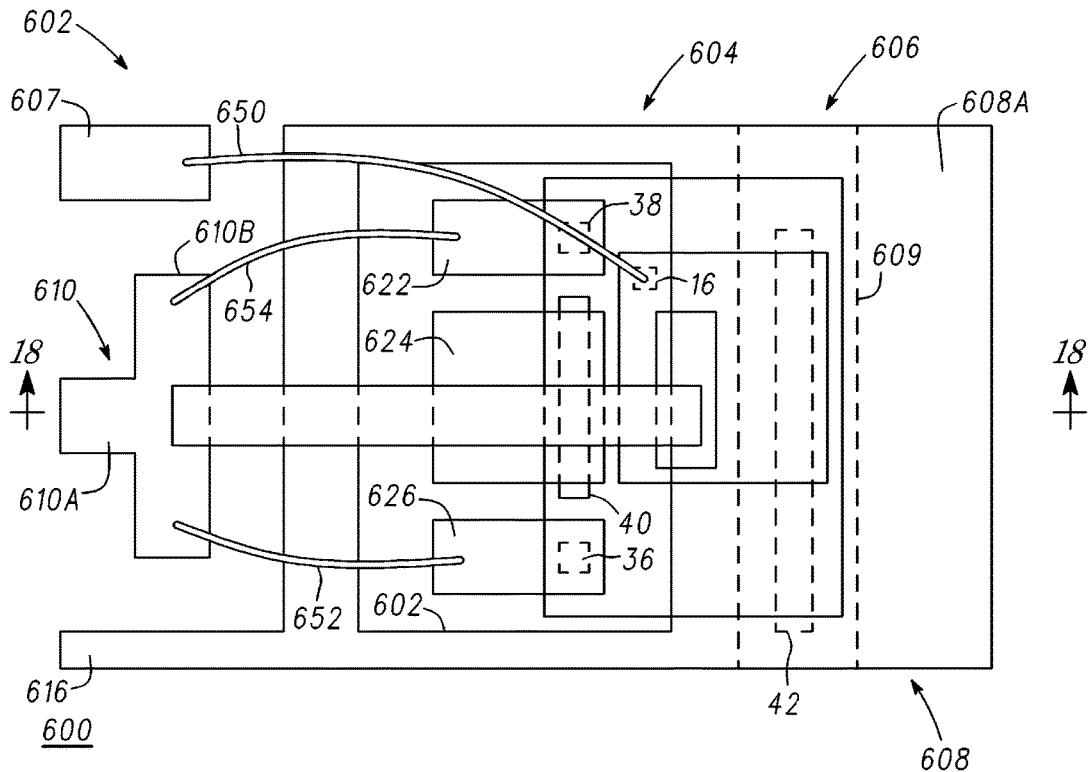
FIG. 17 is a top view of a semiconductor chip suitable for use in manufacturing a cascode configured semiconductor component in accordance with another embodiment of the present invention.
Figure 18:
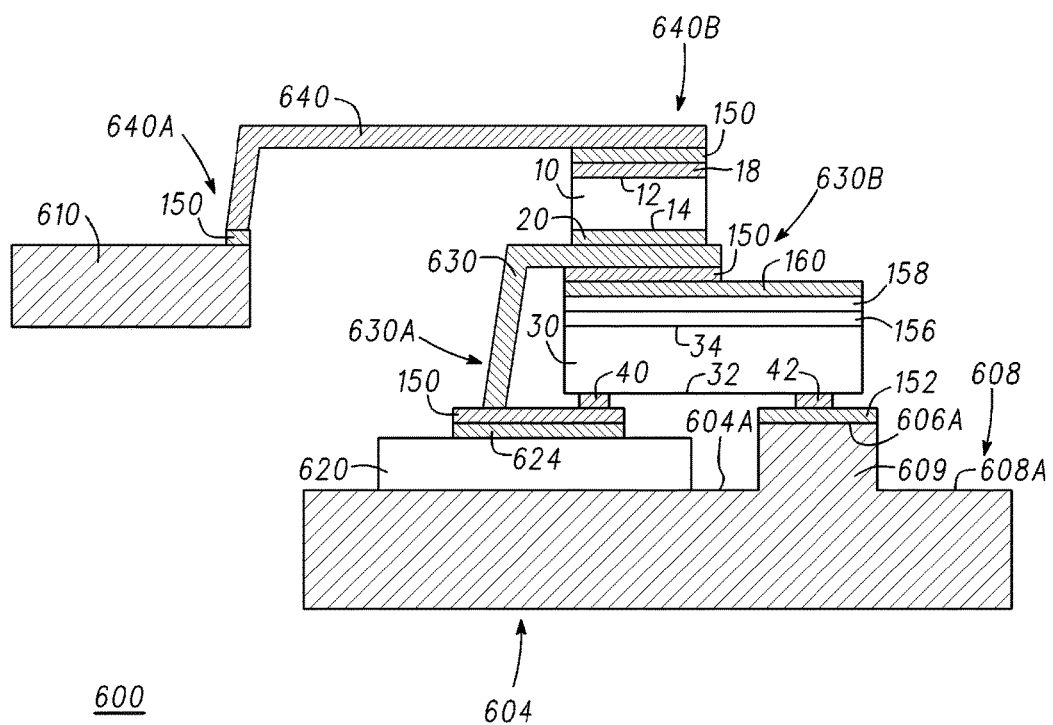
FIG. 18 is a cross-sectional view of the cascode configured semiconductor component of FIG. 17 taken along section line 18-18 of FIG. 17.

FIG. 17 is a top view of a semiconductor component 600 comprising support 602 to which a semiconductor chip 30 is mounted in a flip-chip configuration. A semiconductor chip 10 is mounted to semiconductor chip 30. Support 502 and semiconductor chips 10 and 30 are configured for packaging in a through hole package. FIG. 18 is a cross-sectional view of semiconductor component 600 taken along section line 18-18 of FIG. 17. For the sake of clarity, FIGS. 17 and 18 are described together. Support 602 is comprised of regions 604, 606, and 608, wherein regions 604 and 608 are separated from each other by region 606. Regions 604 and 608 have surfaces 604A and 608A, respectively, that are substantially in the same plane and region 606 has a surface 606A that is in a plane that is above the plane in which surfaces 604A and 608A are located. Thus, a pedestal 609 is formed in region 606, wherein surface 606A is a surface of pedestal 609.

Device receiving portion 604 has an extension 616 extending from a corner of rectangularly shaped support 602, wherein extension 616 serves as a drain lead.

Support 602 is further configured to have a rectangularly shaped electrically conductive structure 607 adjacent to but electrically isolated from device receiving portion 604. In accordance with an embodiment, rectangularly shaped electrically conductive structure 607 serves as a gate lead.

Support 602 is further configured to have an electrically conductive structure 610 adjacent to but electrically isolated from device receiving portion 604. Electrically conductive structure 610 serves as a source lead. By way of example, source lead 610 is comprised of a rectangular portion 610A and a rectangular portion 610B, wherein portions 610A and 610B form a "T-shape."

An electrically insulating material 620 such as, for example ceramic, is mounted to a subportion of device receiving portion 604. Electrically conductive layers 622, 624, and 626 are formed on electrically insulating material 620, wherein electrically conductive layers 622, 624, and 626 are positioned laterally with respect to each other and are electrically isolated from each other. By way of example, the material of electrically conductive layers 622, 624, and 626 is copper.

A bonding agent 150 is formed on electrically conductive layer 624 and a bonding agent 152 is formed on surface 606A. Source bond pad 40 of III-N semiconductor device 30 is bonded to electrically conductive layer 624 through bonding agent 150 and drain bond pad 42 is bonded to surface 606A of pedestal 609 through bonding agent 152. Gate bond pad 38 of III-N semiconductor device 50 is bonded to electrically conductive layer 622 and gate bond pad 36 is bonded to electrically conductive layer 626. Suitable materials for bonding agents 150 and 152 include solder, electrically conductive epoxy, or the like.

A die attach material 156 is formed on surface 34 of III-N semiconductor device 30 and an electrically insulating material 158 is mounted to die attach material 156. By way of example, electrically insulating material 158 is ceramic. A bondable layer 160 is formed on ceramic 158 and a bonding agent 150 is formed on bondable layer 160, which bonding layer 160 may be, for example, copper. An electrically conductive interconnect 630 is connected between bondable layer 160 and electrically conductive layer 624. By way of example, electrically conductive interconnect 630 is a clip having a terminal 630A and a terminal 630B, where terminal 630A is electrically connected to electrically conductive layer 624 through bonding agent 150 and terminal 530B is bonded to bondable layer 160. A bonding agent 150 is formed on terminal 630B of clip 630 and drain electrode 20 of silicon based semiconductor chip 10 is bonded to clip 630. Thus, clip 630 electrically connects drain electrode 20 of silicon based semiconductor chip 10 to source bond pad 40 of III-N based semiconductor chip 30.

Source bond pad 18 of silicon based semiconductor chip 10 is electrically connected to source lead 610 through an electrically conductive interconnect 640. By way of example, electrically conductive interconnect 640 is a clip having a terminal 640A and a terminal 640B, where terminal 640A is bonded to source lead 610 through bonding agent 150 and terminal 640B is bonded to source bond pad 18 through bonding agent 150.

Gate bond pad 16 of silicon semiconductor device 10 is electrically connected to gate lead 607 by a bond wire 650. A bond wire 652 is connected between source lead 610 and electrically conductive layer 626 to electrically connect source lead 610 to gate bond pad 36 and a bond wire 654 is connected between source lead 610 and electrically conductive layer 622 to electrically connect to source lead 610 to gate bond pad 38.

As those skilled in the art are aware, support 602, including regions 604, 606, and 608, semiconductor chips 10 and 30, electrically conductive interconnects 630 and 640 may be encapsulated in a protection material (not shown) such as, for example a mold compound. It should be noted that after encapsulation, gate lead 607, source lead 610, and drain lead 616 extend from the mold compound. In accordance with an embodiment, the mold compound is a thermally enhanced mold compound.

Semiconductor component 600 may be represented schematically by circuit schematic 80 of FIG. 4, where transistor 84 of FIG. 4 represents III-N transistor 30 of FIGS. 17 and 18 and transistor 82 of FIG. 4 represents silicon transistor 10 of FIGS. 17 and 18. Thus, the substrate material of III-N transistor 30 of semiconductor component 600 is electrically isolated from the source lead 610, drain lead 616, and gate lead 607 of semiconductor component 600 and thus is floating. It should be appreciated that semiconductor component 300 is in a through hole package and that support 602 conforms with through hole package outlines such as, for example, a TO-220 outline, a TO-247 outline, a TO-264 outline, a TO-257 outline, or the like. It should be further appreciated that semiconductor chip 30 can be replaced with semiconductor chip 70 so that bonds may be formed over active areas of the semiconductor chip 70. As discussed above, placing the bond pads over an active area increases the contact area, reduces cost, and improves thermal performance.

Figure 19:
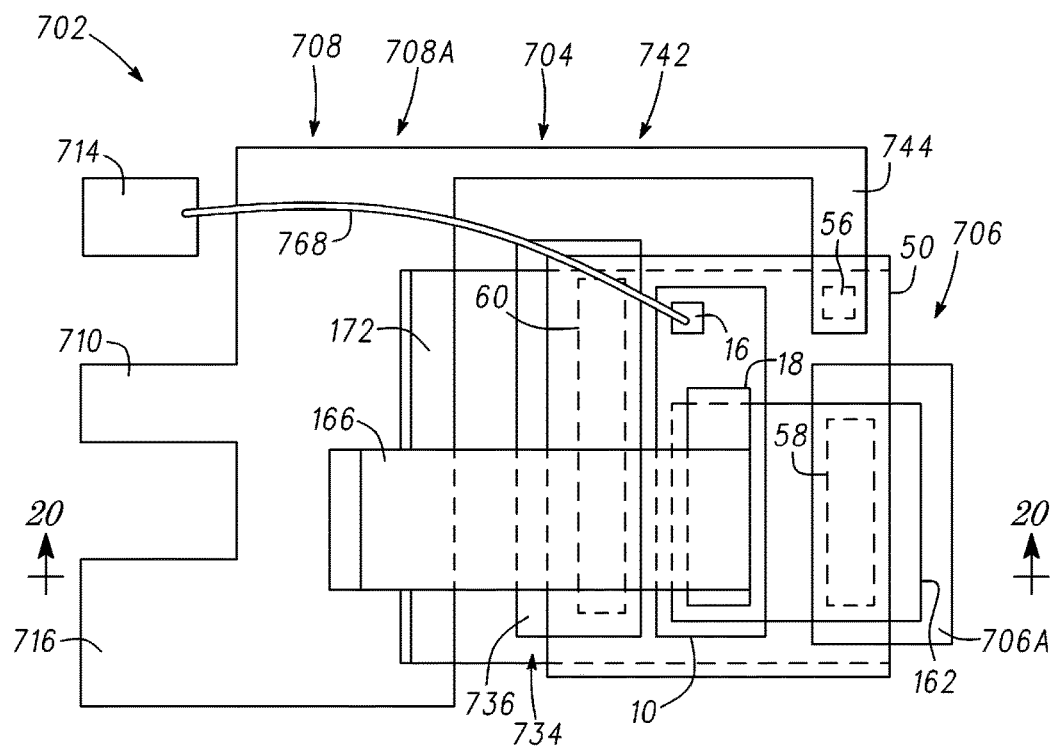
FIG. 19 is a top view of a cascode configured semiconductor component in accordance with another embodiment of the present invention.
Figure 20:
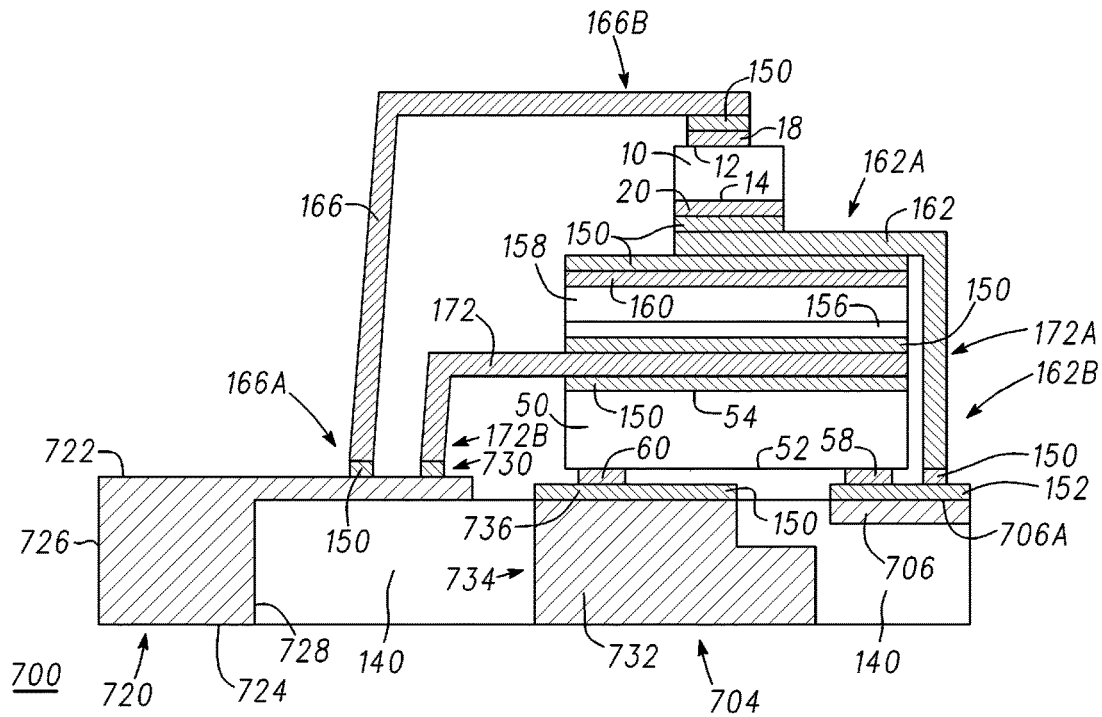
FIG. 20 is a cross-sectional view of the cascode configured semiconductor component of FIG. 19 taken along section line 20-20 of FIG. 19.

FIG. 19 is a top view of a semiconductor component 700 comprising a support 702 to which a semiconductor chip 50 is mounted in a flip-chip configuration. A semiconductor chip 10 is mounted to semiconductor chip 50. Support 702 and semiconductor chips 10 and 50 are configured for packaging in a QFN package. FIG. 20 is a cross-sectional view of semiconductor component 700 taken along section line 20-20 of FIG. 19. For the sake of clarity, FIGS. 19 and 20 are described together. More particularly, support 702 may be manufactured from an electrically conductive material such as, for example, copper. Support 702 includes device receiving portions 704 and 706 and an interconnect portion 708. In a top view, interconnect portion 708 is an electrically conductive "F" shaped structure having a rectangularly shaped body 708A from which a source lead 716 extends and a Kelvin lead 710 extends. Thus, source lead 716 and Kelvin lead 710 are integrally formed with and extend from interconnect portion 708. In accordance with an embodiment, Kelvin lead 710 extends from a central region of rectangularly shaped body 708A and source lead 716 extends from an end region of rectangularly shaped body 708A. It should be noted that source lead 716 is shown as being wider than Kelvin lead 710, however this is not a limitation of the present invention. For example, source lead 716 and Kelvin lead 710 can have the same width or Kelvin lead 710 can be wider than source lead 716. A gate lead 714 is formed adjacent to and electrically isolated from support 702.

In a cross-sectional view of support 702, interconnect portion 708 has a rectangularly shaped base structure 720 having surfaces 722 and 724, edges 726 and 728 and an arm or extension 730 extending from edge 728 adjacent surface 722. Device receiving portion 704 having a base 732 from which a pedestal 734 extends. In accordance with an embodiment, pedestal 734 has a surface 736 that is in substantially the same plane as surface 722. Device receiving portion 706 is a rectangularly shaped portion having a surface 706A that is in substantially the same plane as surfaces 722 and 736. A thermally enhanced mold compound 140 is between extension 730 and pedestal 734. In addition, thermally enhanced mold compound 140 is between pedestal 734 and device receiving portion 706. Alternatively, a ceramic material may be positioned under extension 730 and under device receiving portion 706 to provide additional support.

Support 702 further includes an extension 742 extending from rectangularly shaped body 708A. Extension 742 has a gate interconnect portion 744.

A bonding agent 150 is formed on surface 736 and a bonding agent 152 is formed on surface 706A. Drain bond pad 60 of III-N semiconductor device 50 is bonded to pedestal 734 through bonding agent 150 and source bond pad 58 is bonded to surface 706A of device receiving portion 706 through bonding agent 152. Suitable materials for bonding agents 150 and 152 include solder, electrically conductive epoxy, or the like.

A bonding agent 150 is formed on surface 54 of III-N semiconductor device 50. An electrically conductive interconnect 172 is connected between bonding agent 150 and interconnect portion 708. More particularly, electrically conductive interconnect 172 is a clip having a terminal 172A and a terminal 172B, where terminal 172B is bonded to interconnect portion 708 through bonding agent 150 and terminal 172A is bonded to substrate of the III-N semiconductor 50.

A bonding agent 150 is formed on the terminal 172A of the clip 172. A die attach material 156 is formed on bonding agent 150 and an electrically insulating material 158 is mounted to die attach material 156. By way of example, electrically insulating material 158 is ceramic. A bondable layer 160 is formed on ceramic layer 158 and a bonding agent 150 is formed on bondable layer 160. By way of example, bondable layer 160 is copper. An electrically conductive interconnect 162 is connected between bondable layer 160 and device receiving portion 706. More particularly, electrically conductive interconnect 162 is a clip having a terminal 162A and a terminal 162B, where terminal 162A is bonded to bondable layer 160 through bonding agent 150 and terminal 162B is bonded to device receiving portion 706 through bonding agent 150. A bonding agent 150 is formed on terminal 162A of clip 162 and drain electrode 20 of silicon based semiconductor chip 10 is bonded to clip 162. Thus, clip 162 electrically connects the drain electrode of silicon based semiconductor chip 10 to source bond pad 60 of III-N based semiconductor chip 50 through bonding agent 150 and bonding agent 152.

Source bond pad 18 of silicon based semiconductor chip 10 is electrically connected to interconnect portion 708 through an electrically conductive interconnect 166. More particularly, electrically conductive interconnect 166 is a clip having a terminal 166A and a terminal 166B, where terminal 166A is bonded to interconnect portion 708 through bonding agent 150 and terminal 166B is bonded to source bond pad 18 through bonding agent 150.

Gate bond pad 16 of silicon semiconductor device 10 is electrically connected to gate lead 714 by a bond wire 768. Bond wire 768 may be referred to as a bonding wire or a wirebond.

As those skilled in the art are aware, support 702, including device receiving portions 704 and 706, interconnect portion 708, semiconductor chips 10 and 50, electrically conductive interconnects 162 and 166 may be encapsulated in a protective material such as, for example a mold compound (not shown). It should be noted that after encapsulation, Kelvin lead 710, source lead 716, and gate lead 714 extend from the mold compound. In accordance with an embodiment, the mold compound is a thermally enhanced mold compound.

Semiconductor component 700 may be represented schematically by circuit schematic 97 of FIG. 6, where transistor 84 of FIG. 6 represents III-N transistor 50 of FIGS. 19 and 20 and transistor 82 of FIG. 6 represents silicon transistor 10 of FIGS. 19 and 20. Thus, the substrate material, i.e., substrate, of III-N transistor 50 of semiconductor component 700 is connected to the source 18 of the silicon transistor 10 and to source lead 716 of the cascoded device. It should be appreciated that semiconductor component 700 is in a QFN package. It should be further appreciated that semiconductor chip 50 can be replaced with semiconductor chip 90 so that bonds may be formed over active areas of the semiconductor chip 90. As discussed above, placing the bond pads over an active area increases the contact area, reduces cost, and improves thermal performance.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component having at least first and second terminals, comprising:
    a support having first and second device receiving portions electrically separated from each other, wherein first and second leads are integral with and extend from the first device receiving portion, and wherein the first and second leads extend from a first side of the semiconductor component;
    a third lead adjacent to and electrically isolated from the first and second device receiving portions, wherein the third lead extends from the first side of the semiconductor component; and
    a first semiconductor device having a first surface and a second surface, wherein a first bond pad extends from a first portion of the first surface, a second bond pad extends from a second portion of the first surface and a third bond pad extends from a third portion of the first surface, the first bond pad coupled to the first device receiving portion, the second bond pad coupled to the second device receiving portion, and the third bond pad coupled to the third lead, wherein the first semiconductor device is configured from a III-N semiconductor material.

2. A semiconductor component having at least first and second terminals, comprising:
    a support having first and second device receiving portions, wherein first and second leads are integral with and extend from the first device receiving portion;
    a third lead adjacent to and electrically isolated from the first and second device receiving portions; and
    a first semiconductor device having a first surface and a second surface, wherein a first bond pad extends from a first portion of the first surface, a second bond pad extends from a second portion of the first surface and a third bond pad extends from a third portion of the first surface, the first bond pad coupled to the first device receiving portion, the second bond pad coupled to the second device receiving portion, and the third bond pad coupled to the third lead, wherein the first semiconductor device is configured from a III-N semiconductor material, and wherein the semiconductor device is first field effect transistor having a control electrode and first and second current carrying electrodes, the control electrode of the field effect transistor coupled to the second bond pad, the first current carrying electrode of the field effect transistor coupled to the first bond pad, and the second current carrying electrode of the transistor coupled to the second bond pad and wherein the semiconductor device is mounted in a flip-chip configuration.

3. The semiconductor component of claim 2, wherein the first bond pad is a source bond pad, the second bond pad is a drain bond pad, and the third bond pad is a gate bond pad.

4. The semiconductor component of claim 2, wherein the first bond pad is coupled to the first device receiving portion through a first solder layer, the second bond pad is coupled to the second device receiving portion through a second solder layer, and the third bond pad is coupled to the third lead through a third solder layer.

5. The semiconductor component of claim 1, further including a notch extending into the first device receiving portion from the second surface.

6. The semiconductor component of claim 5, further including mold compound between the first device receiving portion and the second device receiving portion.

7. The semiconductor component of claim 5, further including an electrically conductive interconnect having a first terminal and a second terminal, the first terminal of the electrically conductive interconnect coupled to the first device receiving portion and the second terminal of the electrically conductive interconnect coupled to the second surface of the semiconductor device.

8. The semiconductor component of claim 1, wherein the semiconductor device is a semiconductor chip.

9. The semiconductor component of claim 1, further including a fourth lead wherein the fourth lead is integral with and extends from the second device receiving portion.

10. The semiconductor component of claim 2, wherein the semiconductor device includes a semiconductor material having an active area and passive area, and wherein the first bond pad and the second bond pad are over the passive area.

11. The semiconductor component of claim 2, wherein the semiconductor device includes a semiconductor material having an active area and passive area, and wherein the first bond pad and the second bond pad are over the active area.

12. A semiconductor component having at least first and second terminals, comprising:
    a support having first and second device receiving structures, wherein a first lead extends from the support and is integral with the first device receiving structure;
    a second lead adjacent to and electrically isolated from the first and second device receiving portions; and
    a first semiconductor device having a first surface and a second surface, wherein a first bond pad extends from a first portion of the first surface, a second bond pad extends from a second portion of the first surface and a third bond pad extends from a third portion of the first surface, the first bond pad coupled to the first device receiving portion, the second bond pad coupled to the second device receiving portion, and the third bond pad coupled to the second lead, wherein the first semiconductor device is configured from a III-N semiconductor material.

13. The semiconductor component of claim 12, further including a first electrically conductive clip having a first surface, a second surface, a first terminal, and a second terminal, the first terminal of the first electrically conductive clip electrically connected to the first device receiving structure and the second terminal of the first electrically conductive clip coupled to the second surface of the semiconductor device.

14. The semiconductor component of claim 12, further including:
    an electrically insulating material bonded to the first semiconductor device;
    a first electrically conductive interconnect having a first terminal and a second terminal, the first terminal of the first electrically conductive interconnect coupled to the first device receiving structure and the second terminal of the first electrically conductive interconnect coupled to the electrically insulating material; and
    a second semiconductor device mounted to the first electrically conductive interconnect, the second semiconductor device having a first surface and a second surface, wherein a first bond pad extends from a first portion of the first surface, a second bond pad extends from a second portion of the first surface, and a contact is at the second surface, the contact coupled to the first electrically conductive interconnect.

15. The semiconductor component of claim 14, further including a second electrically conductive interconnect having a first terminal and a second terminal, the first terminal of the second electrically conductive interconnect coupled to the second bond pad of the second semiconductor device and the second terminal of the second electrically conductive interconnect coupled to the device interconnect portion.

16. The semiconductor component of claim 12, further including:
  an electrically insulating material bonded to the first semiconductor device;
  a first electrically conductive interconnect having a first terminal and a second terminal, the first terminal of the first electrically conductive interconnect coupled to the first device receiving structure and the second terminal of the first electrically conductive interconnect coupled to the electrically insulating material;
  a diode mounted to the first electrically conductive interconnect, the diode having an anode and a cathode, the cathode electrically coupled to the first electrically conductive interconnect; and
  a second electrically conductive interconnect coupled between the anode of the diode and the second lead.

17. The semiconductor component of claim 12, wherein the second device receiving structure comprises a pedestal.

18. A method for manufacturing a semiconductor component, comprising:
  providing a support having a first region, a second region, and a third region, the first region separated from the third region by the second region, a pedestal formed in the second region;
  forming an electrically insulating material on the first region;
  forming a plurality of electrically conductive layers on the electrically insulating material; and
  coupling a first semiconductor device to the support in a flip-chip configuration, the first semiconductor device configured from a III-N semiconductor material, wherein the first semiconductor device has a first surface and a second surface, wherein a first bond pad extends from a first portion of the first surface, a second bond pad extends from a second portion of the first surface and a third bond pad extends from a third portion of the first surface, the first bond pad coupled to a first electrically conductive layer, the second bond pad coupled to second electrically conductive layer, and the third bond pad coupled to the pedestal.

19. The method of claim 18, further including:
  bonding a second electrically insulating material to the first semiconductor device;
  coupling a first electrically conductive interconnect between the second electrically conductive layer and the second electrically insulating material; and
  mounting a second semiconductor device to the first electrically conductive interconnect, the second semiconductor device having a first surface and a second surface, wherein a first bond pad of the second semiconductor device extends from a first portion of the first surface, a second bond pad of the second semiconductor device extends from a second portion of the first surface, and a contact of the second semiconductor device is at the second surface, the contact of the second semiconductor device coupled to the first electrically conductive interconnect.

20. The method of claim 19, further including coupling a second electrically conductive interconnect between the second bond pad of the second semiconductor device and the third lead having a first terminal and a second terminal, the first terminal of the second electrically conductive interconnect coupled to the second bond pad of the second semiconductor device and the second terminal of the second electrically conductive interconnect coupled to the third lead.

* * * * *